United States Patent [19]

Berning

[11] 4,163,198

[45] Jul. 31, 1979

[54] AUDIO AMPLIFIER

[76] Inventor: David W. Berning, 11007 Candlelight La., Potomac, Md. 20854

[21] Appl. No.: 858,649

[22] Filed: Dec. 8, 1977

[51] Int. Cl.$^2$ .............................................. H03F 3/16
[52] U.S. Cl. ....................................... 330/277; 330/3; 330/70
[58] Field of Search ...................... 179/1 A; 330/3, 70, 330/71, 277

[56] References Cited

U.S. PATENT DOCUMENTS

| | | | |
|---|---|---|---|
| 3,023,321 | 2/1962 | Isabeau | 307/299 |
| 3,105,196 | 9/1963 | Lerner | 330/3 UX |
| 3,253,225 | 5/1966 | Dalton et al. | 330/3 |
| 3,296,540 | 1/1967 | May | 330/3 |
| 3,361,981 | 1/1968 | Wolcott | 330/3 |
| 3,908,170 | 9/1975 | Buhler | 330/3 |

OTHER PUBLICATIONS

Szekely—"Integrated Linear Audio Frequency Amplifier", RCA Technical Notes–No. 454, 9/1961, pp. 1 & 2.

*Primary Examiner*—Lawrence J. Dahl
*Attorney, Agent, or Firm*—Lane, Aitken & Ziems

[57] ABSTRACT

An audio amplifier including a non-inverting amplifier stage that provides linear amplification without loop feedback for low distortion audio systems. The amplifier stage includes a triode vacuum tube or a triode connected pentode vacuum tube and a P channel field effect transistor (FET). The vacuum tube and the FET are connected in a series combination in which the source of the FET is connected to the cathode of the tube through a suitable resistance. The drain of the FET is connected to a negative voltage and both the gate of the FET and the grid of the tube are at DC ground potential. The input signal to be amplified is fed into the gate of the FET and the output is taken from the plate of the tube which is supplied with a positive voltage through a suitable load. In most applications the grid of the tube is connected to ground, however in some applications the grid may serve as an extra inverting input.

6 Claims, 2 Drawing Figures

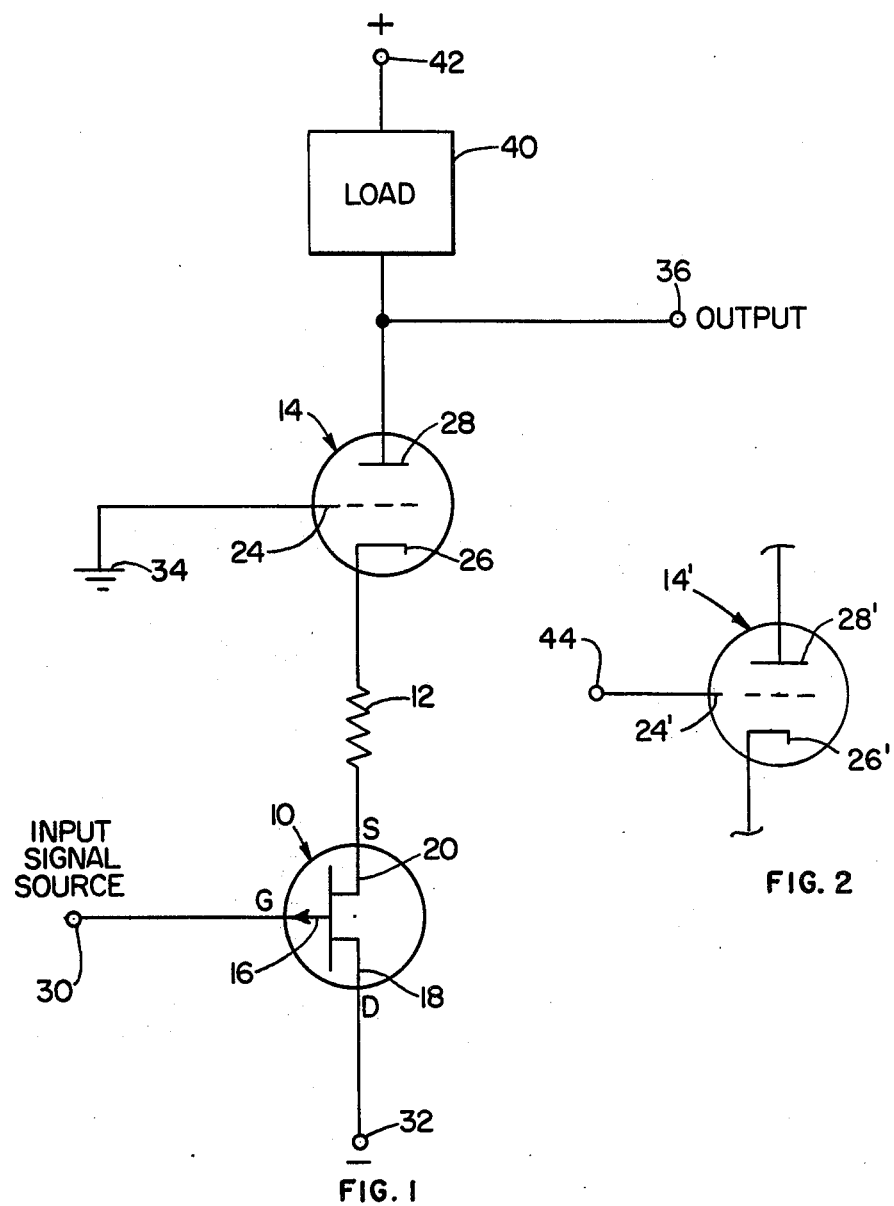

4,163,198

AUDIO AMPLIFIER

BACKGROUND OF THE INVENTION

This invention relates to an audio amplifier and more particularly, to an audio amplifier that enjoys an improved performance when compared to conventional amplifiers, due to an improved linearity in various amplifying stages and a reduction in parisitic interactions.

Some designers of current state-of-the-art audio amplifying equipment are becoming aware of a general lack of correlation between the subjective quality of the sonic performance of such equipment and the objective quality as measured by laboratory measuring instruments. For some years amplifying equipment for high fidelity applications has been designed around its laboratory performance based on a small number of classical steady state tests. One popular test which has gained wide acceptance because of the simplicity involved is the total harmonic distortion test. This test checks for modifications done to a single frequency in the equipment under test. An actual music signal is composed of a large number of frequencies however, and equipment that has been designed to pass a single frequency or a simple combination of frequencies under steady state conditions may not pass a complex, constantly changing wave form with good fidelity.

The traditional method of designing audio equipment involves connecting a number of high gain amplifying stages together and applying a negative feedback loop around the entire number of stages to produce the desired amplifier gain and total harmonic distortion characteristics. Total harmonic distortion figures measured in the laboratory are generally lowest and thus best for those amplifier designs having the largest amount of feedback. The gain stages in most of these types of amplifiers are designed for maximum gain with little attention paid to the linearity of a single isolated stage.

The problems associated with these types of amplifiers are numerous. For example, the subjective quality of performance is generally poor. Also, the phase shift within the amplifier reacts with feedback and causes oscillation. In addition, a form of time delay distortion is produced when a correction signal is fed back through the feedback loop and amplifier after the signal that was to be corrected had already passed out of the amplifier. Transient intermodulation distortion is produced when fast rising waveforms interact with phase compensating networks and high gain—high feedback situations to completely saturate the input stages of the amplifier. Distortion produced from amplifier clipping is much more apparent in a high feedback amplifier for two reasons. First, the electronic devices that make up the amplifier are driven into heavy saturation for which recovery takes a relatively long time. Secondly, the clipping is sharper and more higher order harmonics are generated resulting in a harsher and more obvious clipping sound than would otherwise be generated.

Although prior designs exist which do not use a large negative feedback loop, they are not without problems. For example, the active devices that make up the amplifying stages are somewhat nonlinear in their transfer characteristics thus producing unacceptable levels of harmonic distortion. Also, there are parisitic capacitances between the input and output ports on these active devices which restrict the frequency response of the amplifier and cause higher loading of the source at high frequencies. In addition, the DC voltage levels can drift due to temperature changes and changes in component values thus restricting the useful dynamic range of the amplifier.

SUMMARY OF THE INVENTION

It is therefore, an object of the present invention to provide an amplifier which overcomes the above mentioned problems.

It is also an object of the present invention to provide an amplifier stage which is inherently linear so that harmonic distortion is low.

It is a further object of the present invention to provide an amplifier stage with well controlled gain which can be used as a basic building block for a complete amplifier without the need for feedback.

It is a still further object of the present invention to provide an amplifier that has excellent subjective audio performance.

It is a still further object of the present invention to provide an amplifier stage that has good high frequency performance with minimum phase shift so that the tendency to oscillate is reduced if feedback is applied around a number of such stages.

It is a still further object of the present invention to provide an amplifier stage that is not dependent on feedback for maintenance of good frequency response.

It is a still further object of the present invention to provide an amplifier which does not load the driving source substantially at high frequencies due to parasitic capacitances.

It is a still further object of the present invention to provide an amplifier that does not have time delay distortion.

It is a still further object of the present invention to provide an amplifier free from transient intermodulation distortion.

It is a still further object of the present invention to provide an amplifier in which clipping is much less noticeable when the amplifier is overloaded.

It is a still further object of the present invention to provide an amplifier in which the DC voltage levels are stable over wide temperature ranges and reasonable variations in circuit component values.

Toward the fulfillment of these and other objects, the amplifier stage of the present invention comprises a P channel field effect transistor (FET) having a source electrode, at least one gate electrode, and a drain electrode; circuit means for connecting a gate electrode in series with a signal source; a triode or triode connected pentode vacuum tube having at least a cathode electrode, a grid electrode and a plate electrode; circuit means for connecting the source of the FET to the cathode of the tube through a suitable resistance; circuit means for connecting the grid of the tube to ground or to a source of signal modifications voltage such as feedback voltage as an inverting input; circuit means for extracting an output signal developed across a suitable plate load; and a circuit means to connect the drain of the FET to a negative voltage source.

BRIEF DESCRIPTION OF THE DRAWING

FIG. 1 is a schematic representation of the present invention showing the essential circuitry of an illustrative amplifier stage; and FIG. 2 is a partial schematic representation of the circuitry shown in FIG. 1 illustrating a circuit variation.

DESCRIPTION OF THE PREFERRED EMBODIMENT

As shown in FIG. 1, a P-channel field effect transistor (FET) 10 is coupled through a bias resistance 12 of appropriate value to a triode vacuum tube 14 to form the basic amplifying element. The FET 10 has a gate electrode 16, a drain electrode 18, and a source electrode 20. The tube 14 has a grid electrode 24, a cathode electrode 26, and a plate electrode 28.

The gate electrode 16 of the FET 10 is connected to an input signal source 30 which provides the signal that is to be amplified. The drain electrode 18 of the FET 10 is connected to a source of negative voltage 32. The source electrode 20 of the FET 10 is coupled through the bias resistance 12 to the cathode electrode 26 of the tube 14. The grid electrode 24 of the tube 14 is connected to ground 34 by an appropriate circuit means. An output 36 of the amplifier stage is developed on the plate electrode 28 of the tube 14 across a suitable load impedance 40 which is connected to a positive voltage source 42. The load 40 may take the form, for example, of a resistance across which the output voltage is developed, or a winding of a coupling transformer or the like.

In some applications a signal may be fed into the grid electrode 24 of the tube 14 to modify the signal being amplified which is fed into the gate electrode 16 of the FET 10. This may be done by disconnecting the grid electrode 24 from ground 34 as shown in FIG. 2, reconnecting the grid electrode 24 to a terminal 44 which may then be connected to a source of signal modifying voltage. The grid electrode 24' input, which now becomes a secondary input, is an inverting input and may be used, for example, to provide for negative feedback. The primary signal input at the gate electrode 16 of the FET 10 is a non-inverting input; that is, the output signal that appears on the plate electrode 28' of the tube 14' is in phase with the input signal that is fed to the input of the amplifier.

It is understood that the tube 14 is provided with a heater or filament and suitable voltage for heating the cathode 26 in a conventional manner.

The FET 10 can be of the junction gate type or of the insulated gate type (MOSFET), the only requirement being that it is a P channel device. The FET 10 may also be of the type that has two or more gates which can be connected to extra voltage sources without departing from the scope of this invention.

The vacuum tube 14 can be of the triode, pentode, or other multi-grid type, the only requirement being that it is connected as a triode by connecting extra grids through appropriate circuit means to either the plate electrode or the cathode electrode.

It is further understood that this invention provides an amplifier stage which may be part of a multistage amplifier. The amplifier stage described herein may be used single ended, in push-pull pairs with a common load, cascaded in series, or used in conjunction with other types of amplifier stages to form a complete amplifier without departing from the basic invention.

The advantages of the above circuit are numerous. The combination of the FET and the tube when connected together as an amplifying element is substantially more linear than either the FET or the tube if used by themselves. This provides a means by which audio amplifiers can be built without the need for feedback loops to control harmonic distortion. An amplifier designed with little or no feedback using this above described circuit avoids many other types of distortion such as time delay and transient intermodulation distortion.

Another advantage of the present invention is the complete isolation of the input signal from the output signal. In either a tube or a transistor there is a capacitance between the input and the output such as between the grid and the plate of a tube. A portion of the output voltage is fed back to the input because of this capacitance, and since the input signal is out of phase with the output signal in most configurations, the high frequency performance of the circuit is poor. Furthermore, the signal source is loaded more at high frequencies. In the present design, the plate to grid capacitance does not feed any part of the output signal back to the input, but rather to ground provided the grid is grounded. There is no such feedback in the FET either because the drain is at signal ground, and the source voltage is in phase with the gate signal voltage and comparable in magnitude.

A still further advantage of the amplifier stage of the present invention is that it is stable with respect to temperature variations and component part variations. It is a self-biasing circuit and the input can be biased to DC ground potential with a high value resistor connected from the gate of the FET to ground. The performance of the circuit is not strongly dependent on the drain voltage, the only requirement is that the FET remain in its pentode region of operation. If the grid of the tube is to be used as a second input for signal modification purposes, the same biasing technique can be used for the grid as was used for the gate of the FET, i.e., a high value resistor to ground, as both the grid of the tube and the gate of the FET are high impedance inputs at DC ground potential.

A still further advantage of the amplifier stage of the present invention is that it gives excellent subjective performance when used in an audio amplifier for amplifying music in a high fidelity reproduction system.

The circuit of the present invention is suitable in both small signal, low power circuits as well as for power applications as long as the FET and the tube are selected for the particular application.

It is understood that although the above description relates to a single channel, or mono, system, it is equally applicable to multi-channel design, such as a stereophonic reproduction system.

Of course, variations of the specific construction and arrangement of the amplifier disclosed above can be made by those skilled in the art without departing from the invention as defined in the appended claims.

What is claimed is:

1. An amplifier circuit comprising:
   a vacuum tube having a cathode, a plate, and at least one grid located between said cathode and said plate, said grid connected to a ground potential;
   load means connected between said plate and a source of positive voltage;
   means for extracting an output signal developed across said load means;
   a P-channel field effect transistor having a source electrode, a drain, and at least one gate;
   said drain connected to a source of negative voltage;
   circuit means for connecting said cathode and said source electrode; and
   said gate adapted to be connected to an input signal source.

2. The amplifier claimed in claim 1, wherein:
   said transistor is a junction field effect transistor.

3. The amplifier claimed in claim 1, wherein:
said transistor is an insulated gate field effect transistor.

4. An amplifier circuit comprising:
a vacuum tube having a cathode, a plate, and at least one grid located between said cathode and said plate, least one grid located between said cathode and said plate, said grid adapted to be connected to a source of signal modifying voltage;
load means connected between said plate and a source of positive voltage;
means for extracting an output signal developed across said load means;
a P-channel field effect transistor having a source electrode, a drain, and at least one gate;
said drain connected to a source of negative voltage;
circuit means for connecting said cathode and said source electrode; and
said gate adapted to be connected to an input signal source.

5. The amplifier claimed in claim 4, wherein:
said transistor is a junction field effect transistor.

6. The amplifier claimed in claim 4, wherein:
said transistor is an insulated gate field effect transistor.

* * * * *

UNITED STATES PATENT AND TRADEMARK OFFICE
CERTIFICATE OF CORRECTION

PATENT NO. : 4,163,198
DATED : July 31, 1979
INVENTOR(S) : DAVID W. BERNING

It is certified that error appears in the above-identified patent and that said Letters Patent are hereby corrected as shown below:

Column 5, Line 7, delete "least one grid located between said cathode";

Column 5, Line 8, delete "and said plate,".

Signed and Sealed this

Twentieth Day of November 1979

[SEAL]

Attest:

RUTH C. MASON
Attesting Officer

LUTRELLE F. PARKER
Acting Commissioner of Patents and Trademarks